United States Patent [19]
Cong et al.

[11] Patent Number: 6,002,610
[45] Date of Patent: Dec. 14, 1999

[54] NON-VOLATILE MEMORY ELEMENT FOR PROGRAMMABLE LOGIC APPLICATIONS AND OPERATIONAL METHODS THEREFOR

[75] Inventors: Hong-Ih Louis Cong, Berkeley Heights; Jeffrey Devin Bude, New Providence; Marco Mastrapasqua, Annandale, all of N.J.

[73] Assignee: Lucent Technologies Inc., Murray Hill, N.J.

[21] Appl. No.: 09/069,768

[22] Filed: Apr. 30, 1998

[51] Int. Cl.[6] .................................................. G11C 11/34
[52] U.S. Cl. ............................ 365/185.05; 365/185.17; 365/185.18
[58] Field of Search ...................... 365/185.05, 185.17, 365/185.29, 185.18

[56] References Cited

U.S. PATENT DOCUMENTS

| | | | |
|---|---|---|---|
| 4,829,203 | 5/1989 | Ashmore | 365/185.1 |
| 5,457,653 | 10/1995 | Lipp | 365/185.18 |
| 5,633,518 | 5/1997 | Broze | 257/314 |
| 5,659,504 | 8/1997 | Bude et al. | 365/185.27 |
| 5,740,106 | 4/1998 | Nazarian | 365/185.1 |
| 5,812,450 | 9/1998 | Sansbury et al. | 365/185.01 |

FOREIGN PATENT DOCUMENTS

96 01499  1/1996  WIPO .

*Primary Examiner*—David Nelms
*Assistant Examiner*—Hoai V. Ho

[57] ABSTRACT

An integrated circuit includes at least one non-volatile memory element having first and second non-volatile transistors connected in series between first and second data lines. A junction between the first and second non-volatile transistors forms an output node. The non-volatile memory element further includes an access transistor connected between a reference voltage line and the junction between the first and second non-volatile transistors. In a programmable logic application, for example a field programmable gate array, the non-volatile memory element controls the state of a switching element, which selectively connects logic elements in the programmable logic application. Based on the voltages applied to the non-volatile memory element, the non-volatile memory element is selectively erased, programmed, operated, monitored and powered-up.

14 Claims, 9 Drawing Sheets

|         | ERASE | PROGRAM | OPERATION | READ-BACK | POWER-UP |
|---------|-------|---------|-----------|-----------|----------|
| $V_{CG}$ | -6    | 7       | 4.5       | 4.5       | 0        |
| ADDRESS | 6     | 3       | 0         | 4         | 0        |
| DN      | 4     | 0       | FLOAT     | S.A.      | 0        |
| PDL     | 0     | 4/0     | 3         | 3         | 0        |
| PDH     | 0     | 0/4     | 0         | 0         | 0        |
| $V_{TW}$ | 0     | -3      | 0         | 0         | 0        |

NON-VOLATILE MEMORY ELEMENT FOR PROGRAMMABLE LOGIC APPLICATIONS AND OPERATIONAL METHODS THEREFOR

BACKGROUND OF THE INVENTION

1. Field of the Invention

The present invention relates to a non-volatile memory element; and more particularly, to non-volatile memory element for programmable logic applications.

2. Description of Prior Art

A typical Field Programmable Gate Array (FPGA) includes arrays of logic elements and programmable interconnects. Each programmable interconnect serves to selectively connect logic elements. Accordingly, by programming the programmable interconnects, different logic functions are established.

Usually, a programmable interconnect in an FPGA includes a switching transistor programmed to an open or closed state by a corresponding SRAM memory cell. Based on the programmed state, the switching transistor makes or breaks an electrical connection between logic elements. Storing a logic "1" in an SRAM memory cell, for example, causes the corresponding switching transistor to conduct and electrically connect the logic elements connected to the switching transistor. Unfortunately, once configured, the SRAM memory cells require a constant power supply to maintain the programmed state.

U.S. Pat. No. 5,633,518 discloses a non-volatile programmable interconnect for FPGAs. The non-volatile programmable interconnect of this patent closely integrates the switching transistor with a non-volatile memory element for reducing the area of the FPGA, but substantially complicates the design and chip layout. In this design, the switching transistor and the memory element share a floating gate. Unfortunately, during operation, the switching transistor can inject carriers into the floating gate, and change the programmed state of the programmable interconnect.

SUMMARY OF THE INVENTION

The non-volatile element according to the present invention includes first and second non-volatile transistors connected in series between first and second data lines. A junction between the first and second non-volatile transistors forms an output node. The non-volatile memory element further includes an access transistor connected between a reference voltage line and the junction between the first and second non-volatile transistors. In a programmable logic application, for example a field programmable gate array, an array of non-volatile memory elements controls the state of associated switching elements, each of which selectively connects logic elements in the programmable logic application. Based on the voltages applied to the non-volatile memory element, the non-volatile memory element is selectively erased, programmed, operated, monitored and powered-up.

BRIEF DESCRIPTION OF THE DRAWINGS

The present invention will become more fully understood from the detailed description given hereinbelow and the accompanying drawings which are given by way of illustration only, wherein like reference numerals designate corresponding parts in the various drawings, and wherein.

DETAILED DESCRIPTION OF THE PREFERRED EMBODIMENTS

Figure 1:
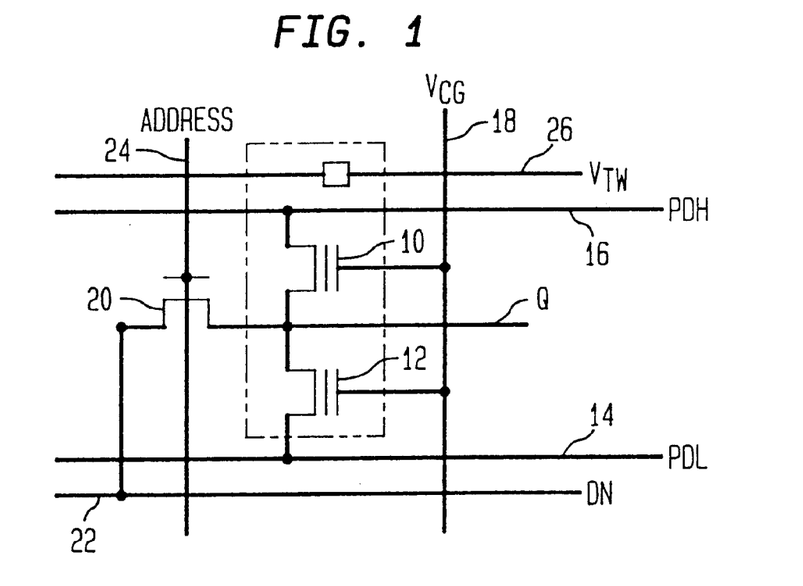
FIG. 1 illustrates a non-volatile memory element or cell according to an embodiment of the present invention.

The following detailed description relates to a non-volatile memory element or memory cell; particularly, a non-volatile memory element for programmable applications. FIG. 1 illustrates the non-volatile memory element or cell according to the present invention. As shown in FIG. 1, the non-volatile memory element includes first and second non-volatile transistors 10 and 12, of n-type, connected in series between a program data low line 14 and a program data high line 16. As the non-volatile transistors, a SIMOS (stacked gate injection MOS) transistor, FLOTOX (floating gate thin oxide) transistor, TPFG (textured poly floating gate) transistor (i.e., a transistor programmed by tunneling between a floating gate and a control gate), etc. among others may be used. For purposes of illustrative discussion, the non-volatile transistors in the described embodiments are considered the SIMOS type. The program data low line 14 supplies a program data low voltage PDL, and the program data high line 16 supplies a program data high voltage PDH. The junction between the first non-volatile transistor 10 and the second non-volatile transistor 12 serves as the output node Q of the memory element. The control gates of the first and second non-volatile transistors 10 and 12 are connected to a control voltage line 18. The control voltage line 18 supplies a control voltage $V_{CG}$.

The non-volatile memory element further includes an access transistor 20 connected between the output node Q and a reference voltage line 22. The access transistor is an N-MOS transistor, and the reference voltage line 22 supplies a reference voltage DN. The gate of the N-MOS transistor 20 is connected to an address line 24, which supplies an address voltage Address. In a preferred embodiment, the portion of the substrate in which the first and second non-volatile transistors 10 and 12 are formed is connected to a substrate bias line 26. The substrate bias line 26 supplies a substrate bias voltage $V_{TW}$.

Figure 2:
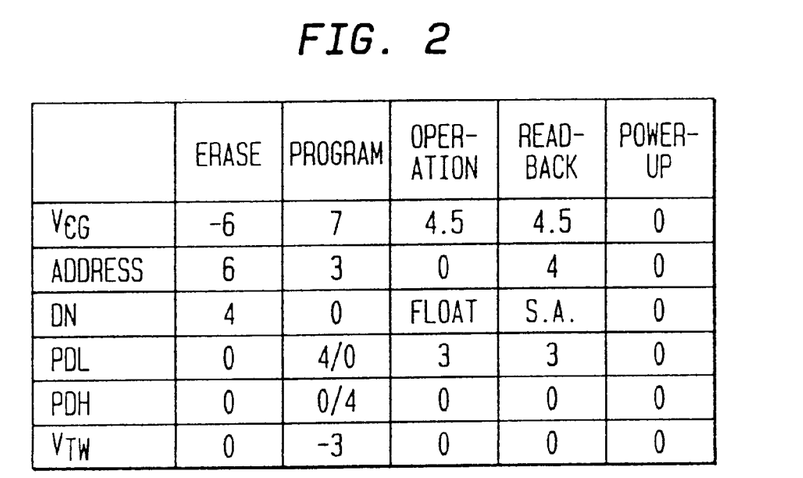
FIG. 2 illustrates a table showing the voltages applied to the non-volatile memory element of FIG. 1.

The memory cell shown in FIG. 1 has several operation modes. Those operation modes include an erase mode, a programming mode, an operation mode, a read-back mode, and a power-up mode. FIG. 2 illustrates a table showing the voltages applied to the program data low line 14, the program data high line 16, the control voltage line 18, the reference voltage line 22, the address line 24, and substrate bias line 26 during each of the operation modes. One skilled in the art will understand, however, that the voltages given in FIG. 2 are merely an example set of voltages, and that operation of the memory cell according to the present invention is not limited to the voltages given in FIG. 2. Instead, the voltages chosen will vary depending on, at least, hardware constraints, semiconductor processing techniques, and type of circuit to which the memory cell is applied. Furthermore, instead of n-type non-volatile transistors and an n-type access transistor, p-type non-volatile transistors and a p-type access transistor can be used with related changes made to the applied voltages. Operation within each of the operation modes shown in FIG. 2 is described in detail below.

Figure 3:
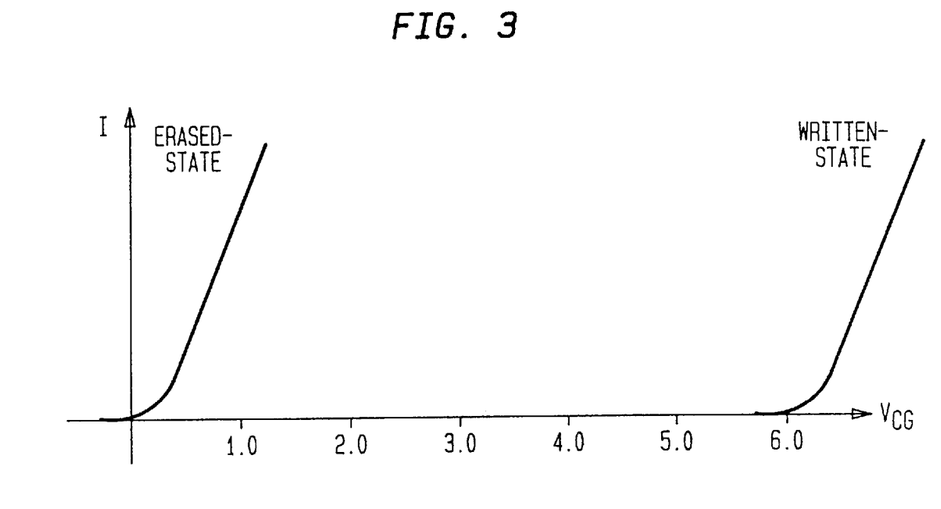
FIG. 3 illustrates the current-voltage (I–V) characteristics for the non-volatile transistors in the memory cell of FIG. 1.
Figure 4:
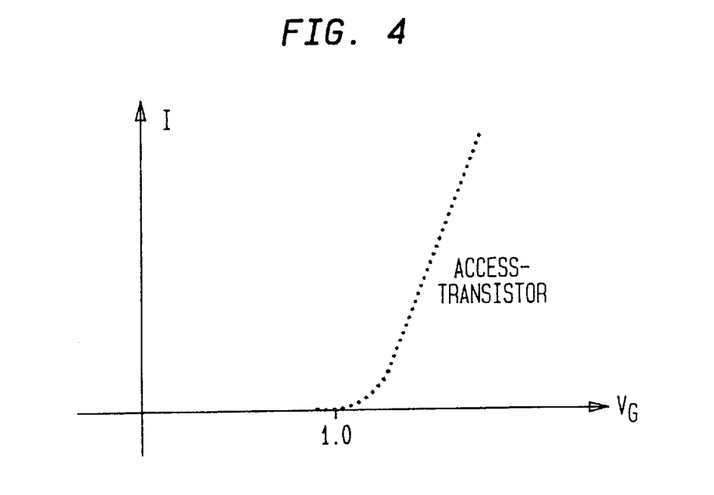
FIG. 4 illustrates the I–V characteristics for the N-MOS transistor in the memory cell of FIG. 1.

FIG. 3 illustrates the I–V characteristics for the first and second non-volatile transistors 10 and 12, and FIG. 4 illustrates the I–V characteristics for the N-MOS transistor 20.

Figure 5:
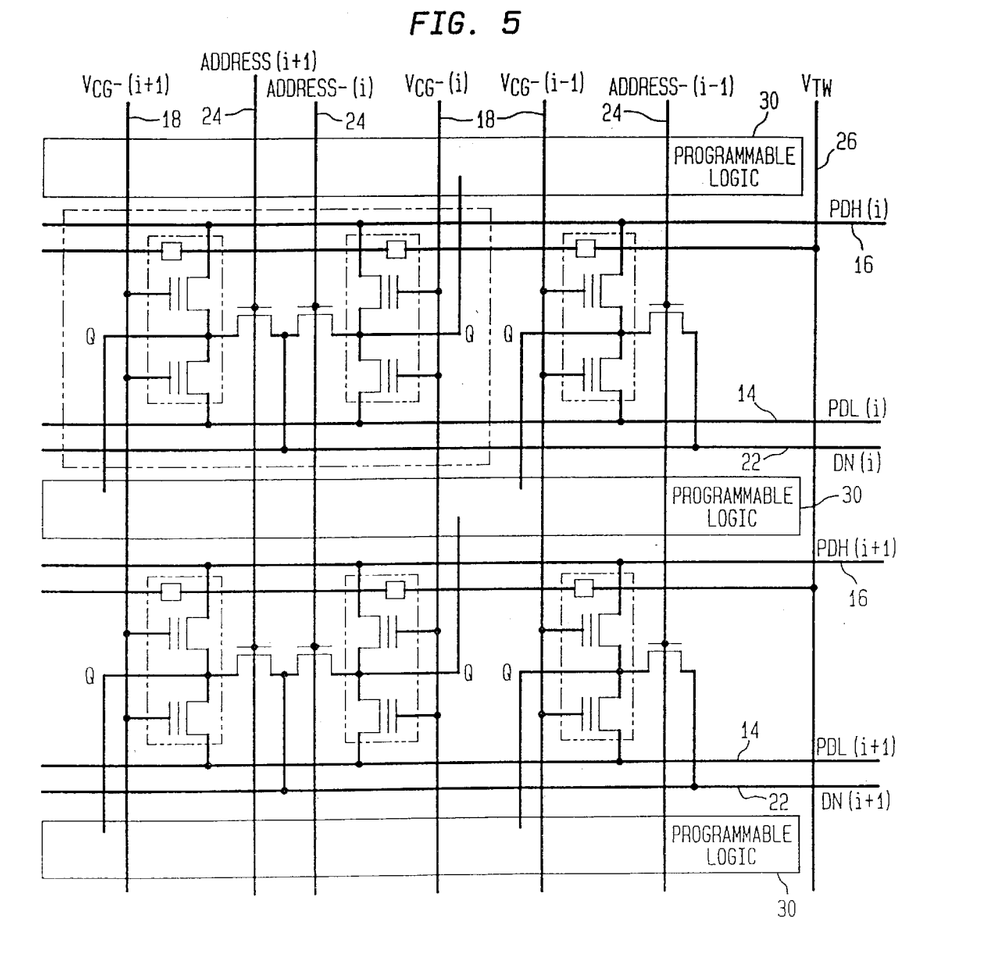
FIG. 5 illustrates a viable memory array architecture for an FPGA application including non-volatile memory elements as in FIG. 1.

A viable memory array architecture for FPGA application is shown in FIG. 5. As shown, adjacent memory cells according to the present invention have their N-MOS transistors 20 sharing a common connection to the reference voltage line 22. As further shown in FIG. 5, each row of memory cells is connected to the same program data low line 14, program data high line 16, and reference voltage line 22. Columns of memory cells share the same control voltage and address lines 18 and 24. All the memory cells, as shown in FIG. 5, share the same substrate bias line 26. The output node Q of each memory cell is connected to the programmable logic 30 in the FPGA; and more particularly, to a switching transistor within the programmable logic 30. Also, depending on the type of switching transistor, an inverter can be connected to the output node Q.

Figure 6:
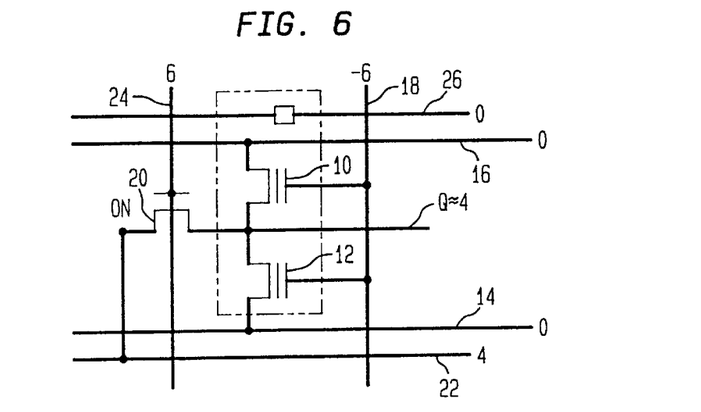
FIGS. 6–8 illustrate voltages applied to selected and unselected memory cells according to the present invention in the erase mode.

The erase operation mode will now be described with respect to FIGS. 6–8. FIG. 6 illustrates a memory cell in the array of memory cells shown in FIG. 5 selected for erasure, and also illustrates the voltages applied to the memory cell. As shown, zero volts is applied to the program data low line 14, the program data high line 16, and the substrate bias line 26. Four volts and six volts are applied to the reference voltage line 22 and the address line 24, respectively, while negative six volts is applied to the control voltage line 18.

The six volts applied to the address line 24 causes the N-MOS transistor 20 to turn on and apply the four volts on the reference voltage line 22 to the junction between the first and second non-volatile transistors 10 and 12 (i.e., the output node Q). The large potential difference between the voltage at the control gates of the first and second non-volatile transistors 10 and 12, which is the negative six volts applied to the control voltage line 18, and the junction between the first and second non-volatile transistors 10 and 12, causes electrons to tunnel from the floating gates of the first and second non-volatile transistors 10 and 12 to the junction between the first and second non-volatile transistors 10 and 12. Accordingly, the first and second non-volatile transistors 10 and 12 shown in FIG. 6 have a very low and possibly negative threshold.

Generally, a negative threshold proves problematic during, for example, the programming mode. For FPGA application using the memory element according to the present invention and as discussed in more detail below, however, a moderate negative threshold voltage (Vth>–2 V) can be tolerated during the programming mode by using the channel initiated secondary electron injection (CHISEL) mechanism.

Figure 7:
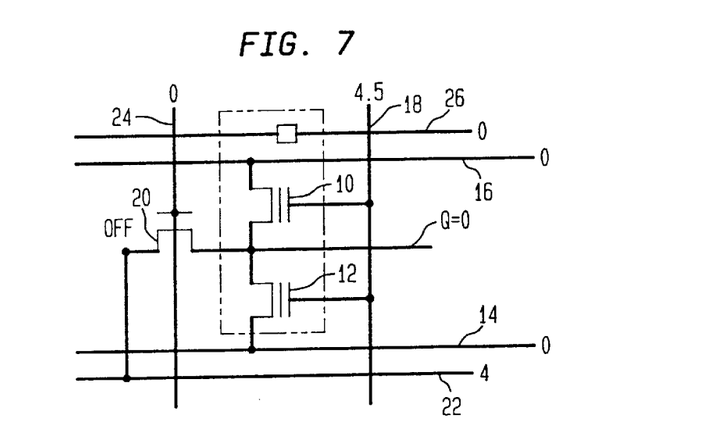

FIG. 7 illustrates an unselected memory cell in the same row of memory cells as the memory cell shown in FIG. 6. The memory cell shown in FIG. 7 remains unselected even though it receives the same program data low, program data high, reference and substrate bias voltages as the memory cell shown in FIG. 6 because the memory cell shown in FIG. 7 receives different control and address voltages. Specifically, 4.5 volts is applied to the control voltage line 18, and zero volts is applied to the address line 24. The N-MOS transistor 20 does not turn on and supply the four volts on the reference voltage line 22 to the output node Q, and a large potential difference does not exist between the control gates of the first and second non-volatile transistors 10 and 12 and the junction between the first second non-volatile transistors 10 and 12. Therefore, electrons do not tunnel from the floating gate in each of the first and second non-volatile transistors 10 and 12.

Figure 8:
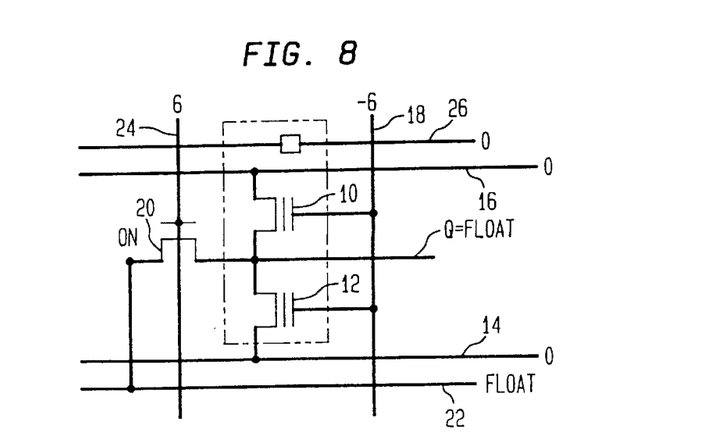

FIG. 8 illustrates an unselected memory cell in the same column of memory cells as the memory cell shown in FIG. 6. The memory cell shown in FIG. 8 remains unselected even though it receives the same control voltage and address voltage as the memory cell shown in FIG. 6 because the memory cell shown in FIG. 8 receives a different reference voltage on the reference voltage line 22. Specifically, the reference voltage line 22 is allowed to float, and though the N-MOS transistor 20 turns on, the junction between the first and second non-volatile transistors 10 and 12 floats. Therefore, a large potential difference does not exist between the control gates of the first and second non-volatile transistors 10 and 12 and the junction between the first and second non-volatile transistors 10 and 12, and the tunneling of electrons from the floating gate in each of the first and second non-volatile transistors 10 and 12 does not occur.

Figure 9:
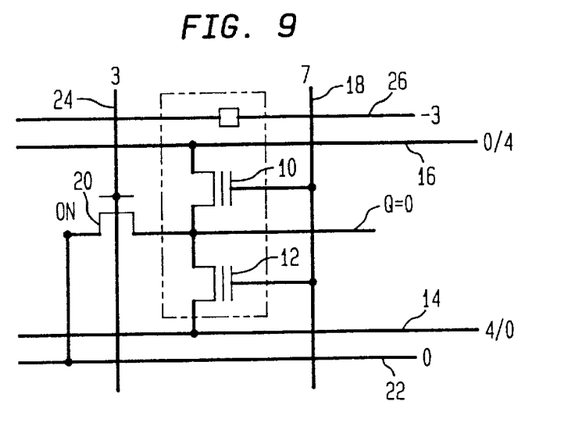
FIGS. 9–11 illustrate voltages applied to selected and unselected memory cells according to the present invention in the programming mode.

Next, the programming mode will be described with respect to FIGS. 9–11. After erasing, only one of the first and second non-volatile transistors 10 and 12 is programmed or written to a high positive threshold value. FIG. 9 illustrates a memory cell selected for programming. As shown in FIG. 9, three volts are applied to the address line 24, seven volts are applied to the control voltage line 18, negative three volts are applied to the substrate bias line 26, and zero volts are applied to the reference voltage line 22. Depending on which of the first and second non-volatile transistors 10 and 12 is being programmed, one of the program data high and low lines 16 and 14 receives a voltage of zero volts, and the other receives a voltage of four volts. For the purposes of discussion, writing the second non-volatile transistor 12 to a high positive threshold will be described. Accordingly, zero volts is applied to the program data high line 16, and four volts is applied to the program data low line 14.

As mentioned previously, in a preferred embodiment, the non-volatile transistors in the present invention are programmed using the CHISEL mechanism disclosed in U.S. Pat. No. 5,659,504 to Bude et al., which is hereby incorporated by reference in its entirety. Accordingly, the first and second non-volatile transistors 10 and 12 can have the structure of any of the embodiments shown in U.S. Pat. No. 5,659,504. Furthermore, it is to be noted that U.S. Pat. No. 5,659,504 describes the programming technique disclosed therein using the acronym CISEI. This acronym, however, has since been changed to CHISEL.

The three volts applied to the address line 24 causes the N-MOS transistor 20 to turn on, and supply the zero volts on the reference voltage line 22 to the junction between the first and second non-volatile transistors 10 and 12. Therefore, a potential difference exists across the second non-volatile transistor 12, but not the first non-volatile transistor 10. This potential difference across the second non-volatile transistor 12 in combination with the potential difference between substrate of the second non-volatile transistor 12 (negative three volts) and the control gate of the second non-volatile transistor 12 (seven volts) causes an injection of electrons into the floating gate of the second non-volatile transistor 12 according to the CHISEL mechanism.

Use of the CHISEL mechanism to program one of the first and second non-volatile transistors 10 and 12 is not necessary. Instead, conventional and well-known injection mechanisms, for example the carrier hot channel (CHE) injection mechanism or the Fowler-Nordheim mechanism, where the substrate and the source electrode of the non-volatile transistor are at the same potential can be used. With the CHISEL mechanism, where a negative voltage is applied to the substrate with respect to the source electrode, several advantages exist. Those advantages include higher injection efficiency, which results in lower programming voltages, and the capability to deselect a non-volatile transistor during programming even though the non-volatile transistor has a negative threshold after erasure.

The technique for programming the first non-volatile transistor 10 is the same as for programming the second non-volatile transistor 12, except that four volts is applied to the program data high line 16 and zero volts is applied to the program data low line 14. Accordingly, programming the first non-volatile transistor 10 will not be described.

Figure 10:
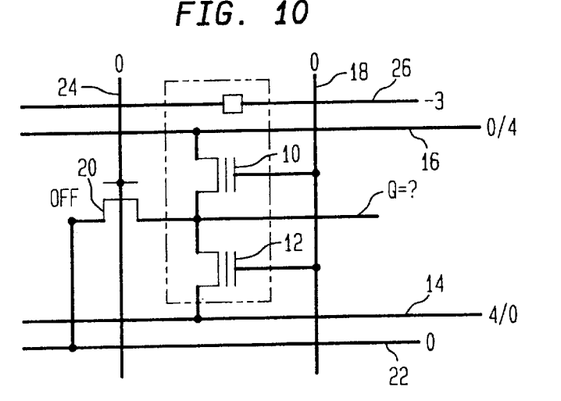

FIG. 10 illustrates an unselected memory cell in the same row as the selected memory cell shown in FIG. 9. The voltages applied to the memory cell shown in FIG. 10 differ in that zero volts is applied to the control voltage line 18 and the address line 24. With only zero volts applied to the address line 24, the N-MOS transistor 20 does not turn on. Moreover, with zero volts at the control voltage line 18 and negative three volts at the substrate bias line 26, the first and second non-volatile transistors 10 and 12 are off. This holds true even if the first and second non-volatile transistors 10 and 12 have moderate negative threshold voltages after erasure because the negative three volts on the substrate bias line 26 shifts the threshold voltage above zero volts. With the first and second non-volatile transistors 10 and 12 off, the junction there-between floats. Consequently, a potential difference does not necessarily exist across either the first or the second non-volatile transistor 10 and 12. Furthermore, with zero volts applied to the control voltage line 18, a significant potential difference does not exist between the substrate of the first and second non-volatile transistors 10 and 12 and the control gates for these transistors. Therefore, electrons are not injected into the floating gate of either the first or second non-volatile transistor 10 and 12.

Figure 11:
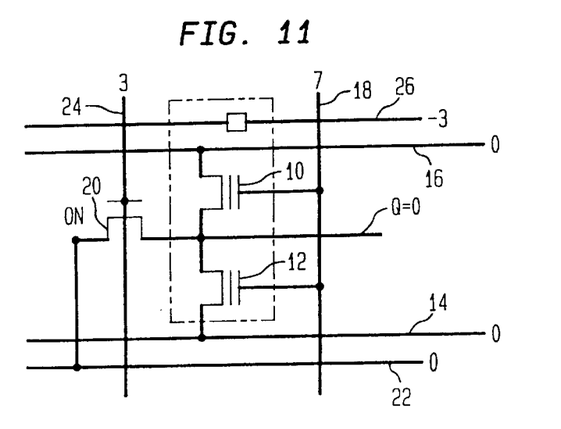

FIG. 11 illustrates an unselected memory cell in the same column as the selected memory cell shown in FIG. 9. The voltages applied to the memory cell shown in FIG. 11 differ in that zero volts is applied to both the program data high line 16 and the program data low line 14. Consequently, a potential difference does not exist across either of the first or second non-volatile transistor 10 and 12. Therefore, injection of electrons into the floating gates of the first and second non-volatile transistors 10 and 12 does not take place.

The operation mode of the memory cell according to the present invention will now be described with respect to FIGS. 12 and 13. Depending on the type of switching transistor used in the FPGA, either a low or a high voltage supplied to the gate of the switching transistor can cause the switching transistor to conduct. For the purposes of discussion only, it will be assumed that a high voltage causes the switching transistor to conduct. Accordingly, FIG. 12 illustrates a memory cell programmed to turn off the corresponding switching transistor, while FIG. 13 illustrates a memory cell programmed to turn on the corresponding switching transistor.

Figure 12:
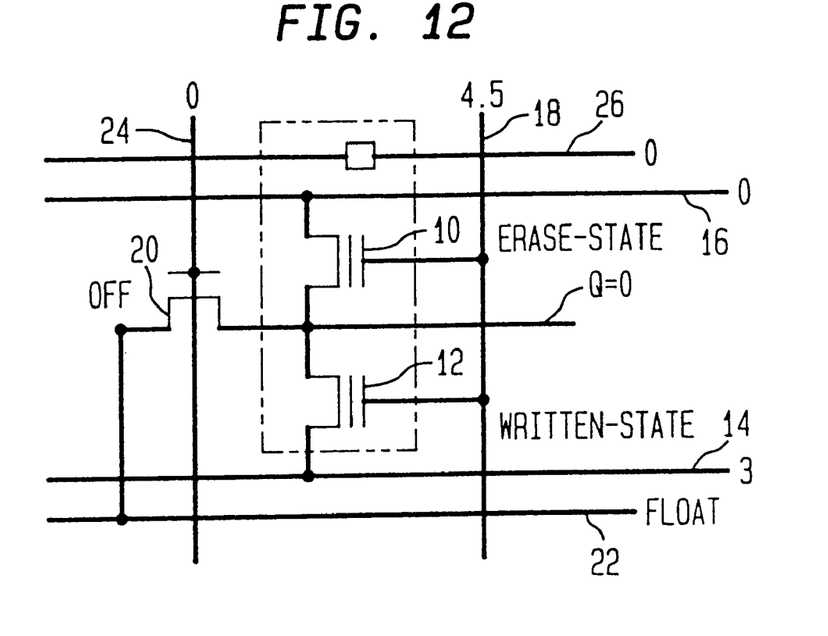
FIGS. 12 and 13 illustrate voltages applied to memory cells according to the present invention in the operation mode.
Figure 13:
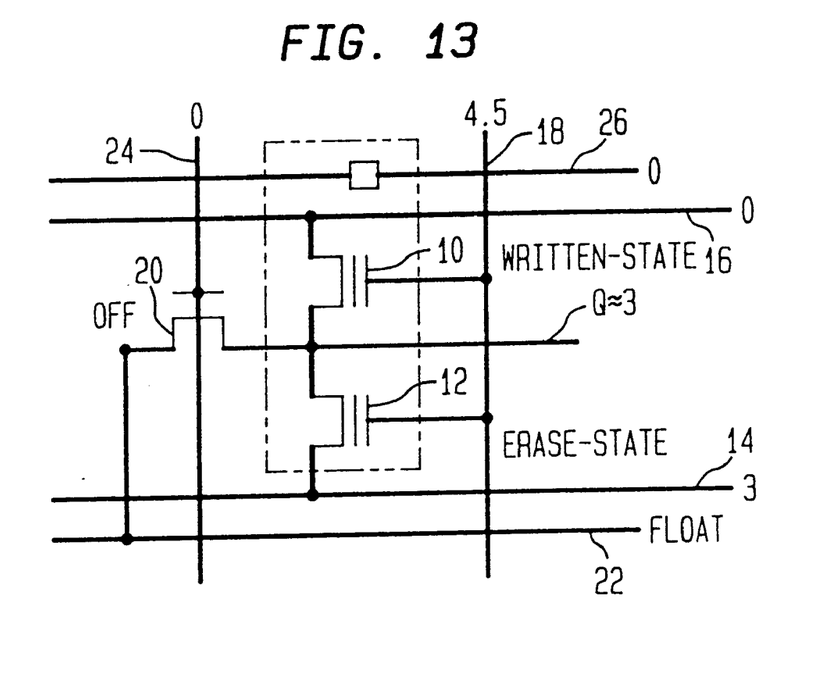

As shown in FIGS. 12 and 13, during the operation mode, zero volts is applied to the program data high line 16, the substrate bias line 26, and the address line 24. The reference voltage line 22 is allowed to float, and 4.5 volts and three volts are applied to the control voltage line 18 and the program data low line 14, respectively. Because zero volts is applied to the address line 24, the N-MOS transistor 20 is turned off, and does not affect the voltage appearing at the output node Q.

In the memory cell shown in FIG. 12, the first non-volatile transistor 10 is in the erase-state, while the second non-volatile transistor 12 has been programmed and is in the written-state. Consequently, the first non-volatile transistor 10 has a very low and possibly negative threshold, while the second non-volatile transistor 12 has a very high positive threshold. The 4.5 volts applied to the control voltage line 18 is sufficient to turn on the first non-volatile transistor 10, but insufficient to turn on the second non-volatile transistor 12. Therefore, only the first non-volatile transistor 10 conducts, and the zero volts on the program data high line 16 is supplied to the output node Q. This causes the corresponding switching transistor to turn off.

FIG. 13 illustrates a memory cell in which the first non-volatile transistor 10 is in the written-state and the second non-volatile transistor 12 is in the erase-state. Accordingly, the second non-volatile transistor 12 is turned on, but the first non-volatile transistor 10 remains off. The second non-volatile transistor 12 conducts about three volts on the program data low line 14 to the output node Q. This causes the corresponding switching transistor to turn on.

Figure 14:
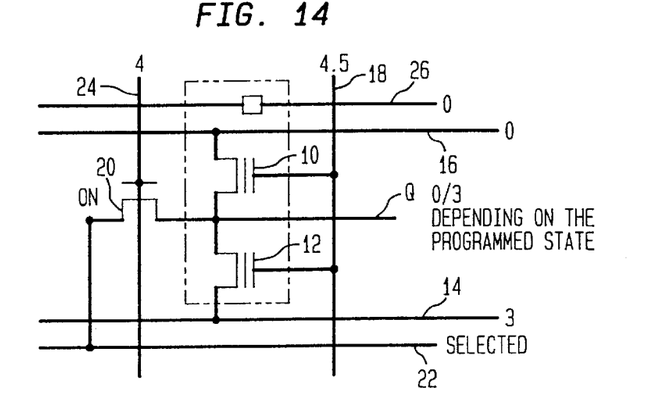
FIGS. 14–16 illustrate voltages applied to selected and unselected memory cells according to the present invention in the read-back mode.

The read-back operation mode will now be described with respect to FIGS. 14–16. In this operation mode, a user can check the status of the programmed memory cells. FIG. 14 illustrates a memory cell selected during the read-back mode. As shown, zero volts is applied to the program data high line 16 and the substrate bias line 26. Three volts is applied to the program data low line 14, and four volts and 4.5 volts are applied to the address line 24 and the control voltage line 18, respectively. During the read-back mode, the reference voltage line 22 is used as the output line for monitoring the programmed state of the memory cell.

The four volts applied to the address line 24 causes the N-MOS transistor 22 to turn on. Also, the 4.5 volts applied to the control voltage line 18 causes the one of the first and second non-volatile transistors 10 and 12 in the erase-state to conduct. Depending on which of the first and second non-volatile transistors 10 and 12 is in the erase-state, either the zero volts on the program data high line 16 or the three volts on the program data low line 14 appears at the output node Q. This voltage is transferred to the reference voltage line 22 via the N-MOS transistor 20, and the programmed state of the memory cell can be determined by monitoring the voltage on the reference voltage line 22.

Figure 15:
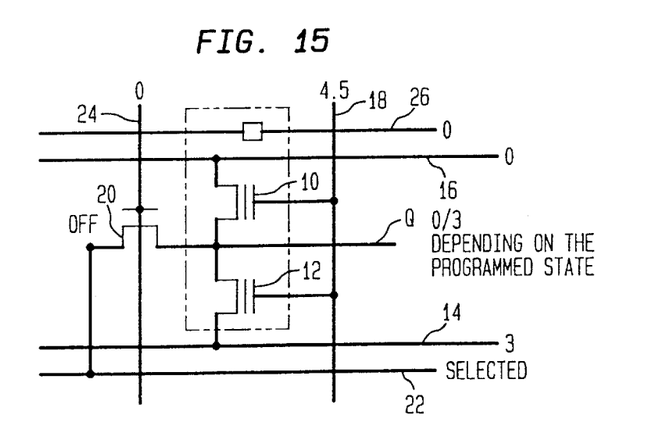

FIG. 15 illustrates an unselected memory cell in the same row as the selected memory cell shown in FIG. 14. The voltages applied to the memory cell shown in FIG. 15 differ from those applied to the memory cell shown in FIG. 14 in that zero volts is applied to the address line 24. Consequently, the N-MOS transistor 20 does not turn on and conduct the voltage at the output node Q to the reference voltage line 22, and this unselected memory cell does not affect the reference voltage line 22 selected for monitoring.

Figure 16:
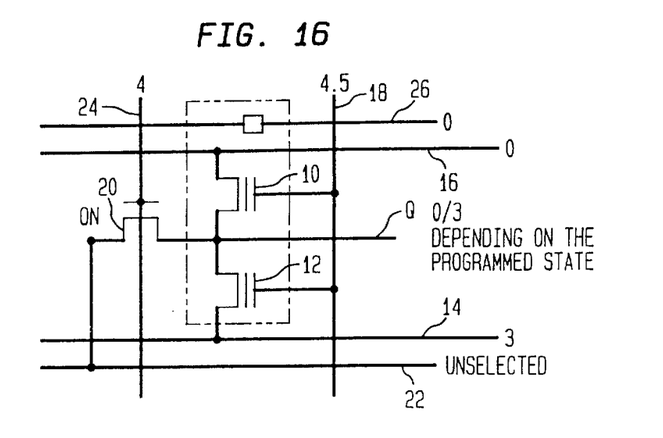

FIG. 16 illustrates an unselected memory cell in the same column as the selected memory cell shown in FIG. 14. The voltages applied to the memory cell shown in FIG. 16 are the same as the voltages applied to the memory cell shown in FIG. 14. The only difference between the memory cell shown in FIG. 16 and the memory cell shown FIG. 14 is that the voltage appearing at the reference voltage line 22 in the memory cell shown in FIG. 16 has not been selected for monitoring.

Figure 17:
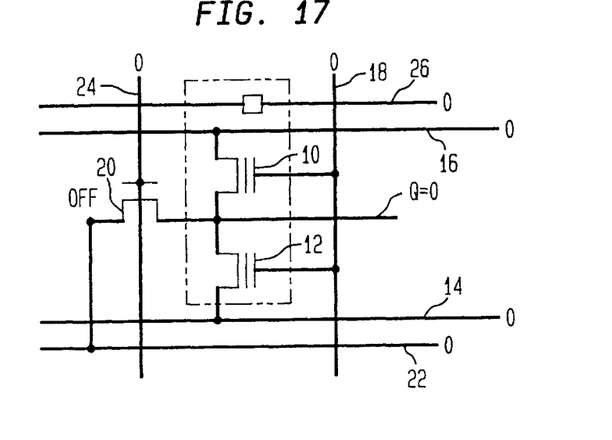
FIG. 17 illustrates voltages applied to memory cells according to the present invention initially during the power-up mode.
Figure 18:
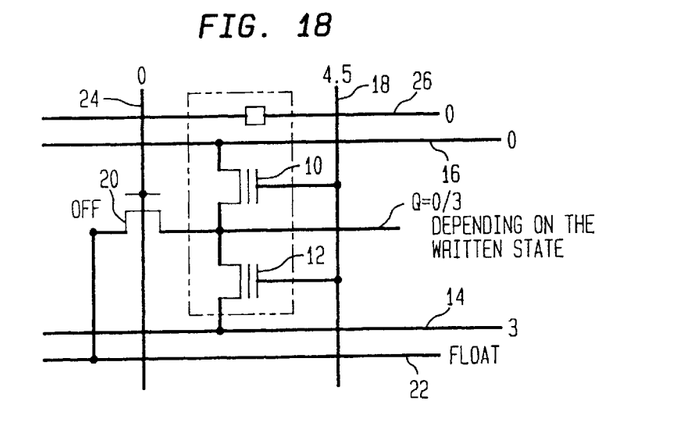
FIGS. 18–20 illustrate voltages applied to selected and unselected memory cells according to the present invention in the power-up mode.

Next, the power-up operation mode will be described with respect to FIGS. 17–20. As shown in FIG. 17, by applying zero volts to each of the voltage lines in the memory cell, all the programmable switches are initially turned off after the chip is powered up. Subsequently, the chip configuration is brought back in a controlled manner. Only a few memory cells are powered-up at a time to avoid possible power dips which can be caused by excessively large current flows through the programmable switches. FIG. 18 illustrates a memory cell selected for power-up. As shown, the same voltages applied to the memory cells during the operation mode are applied to the memory cell shown in FIG. 18.

Figure 19:
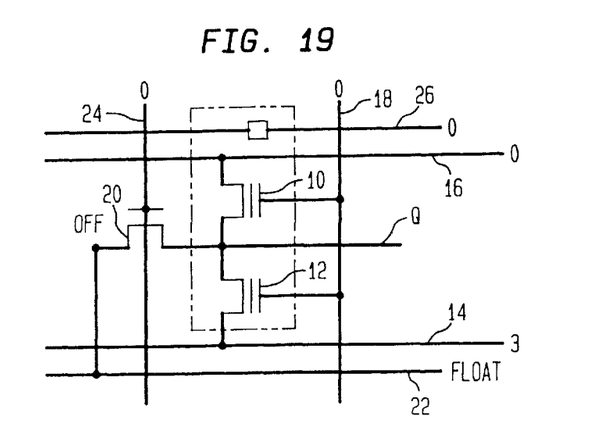

FIG. 19 illustrates an unselected memory cell in the same row as the memory cell shown in FIG. 18. The voltages applied to the memory cell shown in FIG. 19 differ from those applied to the memory cell shown in FIG. 18 in that zero volts is applied to the control voltage line 18. Consequently, the first and second non-volatile transistors 10 and 12 in the memory cell of FIG. 19 do not fully conduct.

Figure 20:
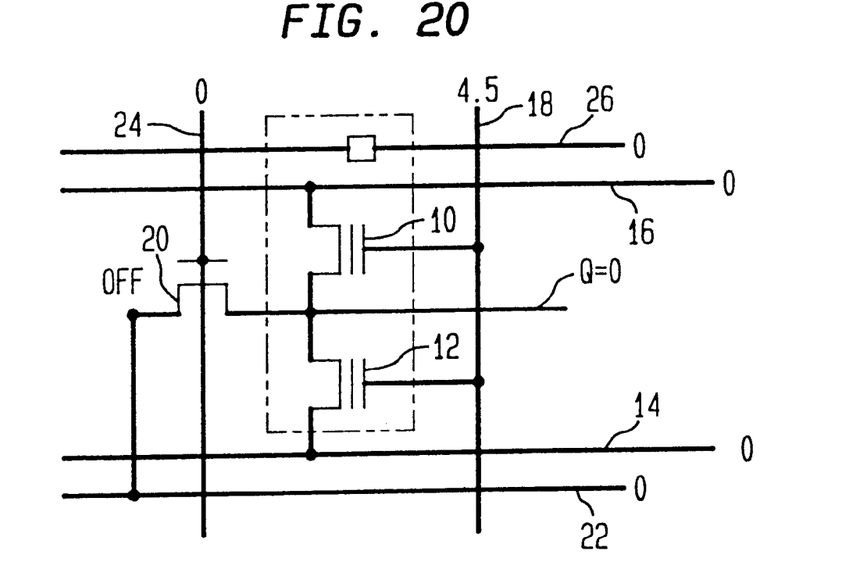

FIG. 20 illustrates an unselected memory cell in the same column as the memory cell shown in FIG. 18. The voltages applied to the memory cell shown in FIG. 20 differ from those applied to the memory cell shown in FIG. 18 in that zero volts is applied to the program data low line 14. Consequently, even though one of the first and second non-volatile transistors 10 and 12 may be turned on, zero volts appears at the output node Q.

Figure 21:
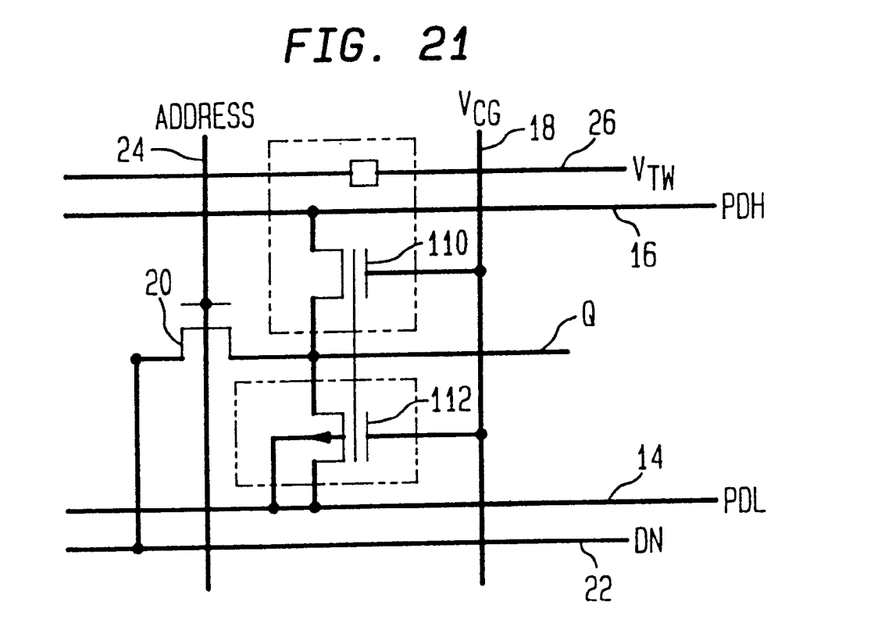
FIG. 21 illustrates a non-volatile memory element or cell according to another embodiment of the present invention.

FIG. 21 illustrates another embodiment of the memory cell according to the present invention. As shown, the memory cell of this embodiment is the same as the memory cell illustrated and described with respect to FIG. 1 except that the first and second non-volatile transistors 10 and 12 have been replaced by an n-type non-volatile transistor 110 and a p-type non-volatile transistor 112, respectively. Additionally, the n-type non-volatile transistor 110 and the p-type non-volatile transistor 112 share a floating gate. Because the remainder of the memory cell illustrated in FIG. 21 is the same as described with respect to FIG. 1, that description will not be repeated.

Furthermore, the memory cell of FIG. 21 operates in substantially the same manner as discussed above with respect to the memory cell of FIG. 1. Therefore, except for some additional advantages provided by the memory cell of FIG. 21, a description of the operation modes of the memory cell shown in FIG. 21 will not be repeated.

Because the n-type non-volatile transistor 110 and the p-type non-volatile transistor 112 share a floating gate, it is sufficient to erase and/or program only one of the n-type non-volatile transistor 110 and the p-type non-volatile transistor 112. For example, erasing the n-type non-volatile transistor 110, puts the n-type non-volatile transistor 110 in the erase-state and the p-type non-volatile transistor in the written-state because these non-volatile transistors are of different types and share a floating gate. Similarly, programming the n-type non-volatile transistor 110, puts the n-type non-volatile transistor 110 in the written-state and the p-type non-volatile transistor in the erase-state. Accordingly, only one of the n-type non-volatile transistor 110 and the p-type non-volatile transistor 112 will turn on in the operation mode.

Unlike the programmable interconnect disclosed in U.S. Pat. No. 5,633,518, programmable interconnects in programmable logic applications utilizing the present invention do not have memory elements closely integrated with the corresponding switching transistors. As a result, chip design and layout are not overly complicated. Instead, the non-volatile memory element according to the present invention can easily replace the SRAM memory cell currently used in FPGAs and other programmable logic applications.

The invention being thus described, it will be obvious that the same may be varied in many ways. Such variations are not to be regarded as a departure from the spirit and scope of the invention, and all such modifications are intended to be included within the scope of the following claims.

What is claimed is:

1. An integrated circuit including a non-volatile memory element, comprising:

first and second non-volatile transistors connected in series between first and second data lines, a junction between said first and second non-volatile transistors forming an output node;

an access transistor connected between a reference voltage line and said junction between said first and second non-volatile transistors; and a substrate bias line connected to a portion of a substrate in which said first and second non-volatile transistors are formed, said substrate bias line receiving a negative voltage when at least one of said first and second non-volatile transistors is programmed.

2. The integrated circuit of claim 1, wherein said first and second non-volatile transistors each have a control gate connected to a control voltage line.

3. The integrated circuit of claim 1, wherein said access transistor has a gate connected to an address line.

4. The integrated circuit of claim 1, wherein said first and second non-volatile transistors each have a control gate connected to a control voltage line; and said access transistor has a gate connected to an address line.

5. The integrated circuit of claim 1, wherein said first non-volatile transistor is an n-type non-volatile transistor, said second non-volatile transistor is a p-type non-volatile transistor, and said n-type non-volatile transistor and said p-type non-volatile transistor share a floating gate.

6. A method of setting a state of a memory cell including first and second non-volatile transistors connected in series between first and second data lines, a junction between said first and second non-volatile transistors forming an output node and control gates of said first and second non-volatile transistors connected to a control voltage line, said memory cell further including an access transistor connected between a reference voltage line and said junction between said first and second non-volatile transistors, said memory cell also including a substrate bias line connected to a portion of a substrate in which said first and second non-volatile transistors are formed; and said method comprising:

creating a potential difference across one of said first and second non-volatile transistors;

applying a positive voltage to said control voltage line; and applying a negative voltage to said substrate bias line.

7. The method of claim 6, wherein said creating step comprises:

applying a first voltage to said reference voltage line;

turning said access transistor on;

applying a second voltage, different from said first voltage, to one of said first and second data lines; and applying said first voltage to one of said first and second data lines not having said second voltage applied thereto.

8. The method of claim 7, wherein said second voltage is greater than said first voltage.

9. The method of claim 7, wherein said first and second non-volatile transistors are n-type non-volatile transistors; and said applying a second voltage step applies said second voltage to said first data line to write said first non-volatile transistor, and applies said second voltage to said second data line to write said second non-volatile transistor.

10. The method of claim 9, wherein when said applying a second voltage step writes said first non-volatile transistor, a threshold of said first non-volatile transistor is increased, and when said applying a second voltage step writes said second non-volatile transistor, a threshold of said second non-volatile transistor is increased.

11. A method of monitoring a programmed state of a memory cell including first and second non-volatile transistors connected in series between first and second data lines, a junction between said first and second non-volatile transistors forming an output node and control gates of said first and second non-volatile transistors connected to a control voltage line, said memory cell further including an access transistor connected between a reference voltage line and said junction between said first and second non-volatile transistors, said method comprising:

applying a first voltage to said control voltage line sufficient to turn on a non-volatile transistor in an erase-state and insufficient to turn on a non-volatile transistor in a write-state;

applying a second voltage to said first data line;

applying a third voltage, different from said second voltage, to said second data line;

turning on said access transistor; and outputting a voltage on said reference voltage line to readout said programmed state of said memory cell.

12. A method of powering-up an array of memory cells, said array of memory cells including columns of address lines and control voltage lines and rows of first and second data lines and reference voltage lines, each memory cell including first and second non-volatile transistors connected in series between said first and second data lines in one row, and control gates of said first and second non-volatile transistors connected to said control voltage line in one column, said memory cell further including an access transistor connected between a reference voltage line for said one row and said junction between said first and second non-volatile transistors, said method comprising:

initially applying a same voltage to said first and second data lines, said control voltage lines, and a junction between said first and second non-volatile transistors of each memory cell; and selectively applying a first voltage to a control voltage line for at least one column of memory cells in said array of memory cells, said first voltage sufficient to turn on a non-volatile transistor in an erase-state and insufficient to turn on a non-volatile transistor in a write-state; and selectively creating a voltage difference between said first and second data lines for at least one row of memory cells in said array of memory cells.

13. The method of claim 12, further comprising:

turning off said access transistor in each memory cell.

14. The method of claim 12, further comprising:

increasing a number of said control voltage lines to which said first voltage is applied; and increasing a number of said first and second data lines between which a voltage difference has been created.

* * * * *